United States Patent [19]
Hossner et al.

[11] Patent Number: 6,157,232
[45] Date of Patent: Dec. 5, 2000

[54] LOCAL CLOCK GENERATOR

[75] Inventors: Steven E. Hossner; Brian F. Reilly, both of Hillsboro; Jeremy H. Smith, Beaverton, all of Oreg.

[73] Assignee: NEC Corporation, Tokyo, Japan

[21] Appl. No.: 09/271,825

[22] Filed: Mar. 18, 1999

[51] Int. Cl.[7] .................................................. H03L 7/08
[52] U.S. Cl. ......................... 327/159; 327/156; 327/105
[58] Field of Search .................................. 327/147, 150, 327/156, 159, 105, 107

[56] References Cited

U.S. PATENT DOCUMENTS

| | | | |
|---|---|---|---|
| 4,458,329 | 7/1984 | Remy | 327/105 |
| 5,256,980 | 10/1993 | Itri | 327/105 |
| 5,406,592 | 4/1995 | Baumert | 375/376 |
| 5,473,274 | 12/1995 | Reilly et al. | 327/159 |
| 5,495,206 | 2/1996 | Hietala | 331/1 A |
| 5,572,167 | 11/1996 | Alder et al. | 331/2 |
| 5,602,884 | 2/1997 | Wieczorkiewicz et al. | 375/376 |
| 5,663,687 | 9/1997 | Kozu | 327/159 |
| 5,705,945 | 1/1998 | Wee | 327/105 |
| 5,754,437 | 5/1998 | Blazo | 327/159 |
| 5,754,598 | 5/1998 | Barret, Jr. et al. | 375/327 |
| 5,774,022 | 6/1998 | Griffin et al. | 331/1 A |

OTHER PUBLICATIONS

Hagiwara et al. "DSP Type First–Order Digital Phase Locked Loop Using Linear Phase Detector", pp. 646–652, 1985.

Hagiwara, et al., "DSP Type First–Order Digital Phase Locked Loop Using Linear Phase Detector", pp. 646–653.

Y.V. Zil'berg, et al., "A Precision Digital Phase Discriminator for a Digital Network Synchonization System", 1992 Scripta Technica, Inc., originally published by Elektrosvyaz', No. 10, 1991, pp. 37–43.

*Primary Examiner*—Tuan T. Lam
*Attorney, Agent, or Firm*—Scully, Scott, Murphy & Presser

[57] ABSTRACT

A local clock system for generating a local clock signal whose frequency and phase are synchronized to the frequency and phase of an external input clock reference signal, wherein the output local clock signal is a non-integer multiple of the input clock reference signal. A numerically controlled generator generates the clock output signal, and the frequency and phase thereof are controlled by a digital tuning word input thereto. An input frequency divider divides the input clock reference signal by a first constant $k_{11}$ or a second constant $k_{22}$, and an output frequency divider for dividing the output signal by a first constant $k_{11}$ or a second constant $k_{21}$. A relay-phase detector receives output signals from the input frequency divider and the output frequency divider, and produces a 0 or a 1 output, which controls the input frequency divider to divide by $k_{12}$ or $k_{22}$ and controls the output frequency divider to divide by $k_{11}$ or $k_{21}$, causing the input frequency divider and the output frequency divider to shift from one set of constants $k_{12}$ and $k_{11}$ to the second set of constants $k_{22}$ and $k_{21}$ upon a change in state of the output signal of the relay-phase detector. A phase accumulator is coupled to the output of the relay-phase detector, for detecting the accumulated phase output of the relay-phase detector, and the output thereof controls the numerically controlled signal generator.

6 Claims, 2 Drawing Sheets

LOCAL CLOCK GENERATOR

BACKGROUND OF THE INVENTION

1. Field of the Invention

The present invention relates to a system for generating a local clock signal synchronized to an external reference clock, and more particularly, to an improved digital system that provides precise control of the local clock, particularly for a SONET local clock generator.

2. Discussion of the Prior Art

A number of systems, for example, the Synchronous Optical Network (SONET) prescribed by ANSI T1.105-1988, "Digital Hierarchy Optical Interface Rates and Formats Specification", require a local clock generator that is precisely synchronized to an external reference clock source. For such applications, the system requires a local clock generator that continues to generate clock signals in the event of a loss of the reference clock source; a so-called clock hold-over mode of operation.

Various proposals have been made in the prior art for controlling a local reference clock source synchronized to an external reference clock. One commonly employed approach is to use a frequency responsive loop to establish initial synchronization between the local clock and the external clock, and to use a phase-locked loop to maintain precise synchronization once initial synchronization has been established. While generally satisfactory, these prior art controllers are relatively complex in their implementation and many do not provide for stable clock operation in the absence of the external reference clock. Further, in synchronizing the local clock to the external clock reference, prior art control systems may generate an excessive jitter in the local clock output, either in response to a jitter in the reference clock, or in establishing synchronization after a lost clock reference. As will be appreciated by those skilled in the art, jitter refers to a displacement in time of a significant instant (e.g., a rising edge) in the actual clock signal from its ideal position in time.

SUMMARY OF THE INVENTION

One object of the present invention is the provision of a local clock controller which provides a stable clock output in the event of loss of the external clock signal.

Another object of the subject invention is the provision of a local clock controller which limits the local clock jitter.

A still further object of this invention is the provision of a local clock system that is relatively simple in its design, and can be implemented with low-cost components.

The present invention provides a SONET local clock generator, the operation of which is entirely in the discrete-time, digital domain. This allows very precise control of the clock's phase-time characteristics through sophisticated digital signal processing algorithms.

The design provides:

1) precise prediction and control of time interval error and jitter output.
2) inherent holdover capability with low drift.
3) accurate measurement of reference signal quality for validation.
4) easy upgrade path (largely in software) in response to change in Bellcore and/or ANSI specifications.
5) use of a very high resolution digital phase detector which compares a non-integer related reference clock signal to an output clock.

The SONET local clock generator of the present invention is used in a SONET Network Element (NE) to provide PCM (Pulse Control Modulation) clock(s) which are synchronized to a network timing reference. In addition, it can also provide DS-1 reference signal outputs to other SONET NEs.

The SONET network reference signal is typically either a DS-1 BITS signal of the recovered optical line signal (line-timing signal). The SONET NE is required to synchronize its internal PCM clock(s) to the reference signal (as provided by the equipment design) and also to provide a synchronized DS-1 BITS-like output (see ANSI T1.105.09, Bellcore GR-253-CORE and GR-1244-CORE for the governing specifications and requirements).

The design of the SONET local clock generator of the subject invention is unique in that it operates entirely in the digital/numerical domain. The phase discriminator is digital and offers high resolution of phase/frequency/time, and output clock signals are generated by a Direct Digital Synthesis (DDS) circuit which employs a Numerically-Controlled Oscillator (NCO). Phase/Frequency tracking and locking is coded in algorithms which run on an inexpensive microprocessor.

The present invention is being utilized as a Synchronization and Timing Unit (STU) on an NEC-APD Vista. SONET Access Multiplexer as a plug module.

The reference signal to be tracked is selected under software control. The unit implements BITS (external) timing, Line-Timing, free-running, and Holdover modes of operation, as required by the governing ANSI and Bellcore specifications.

The present invention relates to a SONET Local Clock Generator as used in a SONET network element to provide PCM clocks which are synchronized to a network timing reference. The reference, or input clock, may be an input from BITS timing, line timing, free running and/or hold-over timing. The subject invention is further distinguished from prior art approaches by being implemented entirely in the discrete-time digital domain. An improved phase discrimination method is derived from the Zil'berg and Koltunov algorithm, and is implemented in software on an inexpensive microprocessor.

The present invention:

1) provides a stable clock that is a non-integer multiple of the intended reference.
2) implements all functions entirely in the digital/numerical domain.
3) provides PCM clock(s) which are synchronized to a network timing reference.
4) provides a synchronized BITS-like reference signal output to other SONET network elements.
5) uses an input reference signal which can be a DS-1 BITS signal or the recovered optical line signal.
6) implements phase and frequency tracking/locking algorithms in software which are easily modified and run on an inexpensive microprocessor.
7) selects the reference signal under software control, which may be one of BITS (extended) timing, Line-Timing, free running, and holdover as required by applicable ANSI/BELLCORE standards.
8) provides precise prediction and control of time interval error and jitter output.
9) implements a holdover capability with low drift.
10) performs accurate measurement of the reference signal quality for validation.
11) provides an easy upgrade path, mostly in software in response to changes in BELLCORE and/or ANSI specifications.

12) uses a very high resolution digital phase detector which compares the non-integer related reference signal to the output clock.

BRIEF DESCRIPTION OF THE DRAWINGS

The foregoing objects and advantages of the present invention for a SONET local clock generator may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
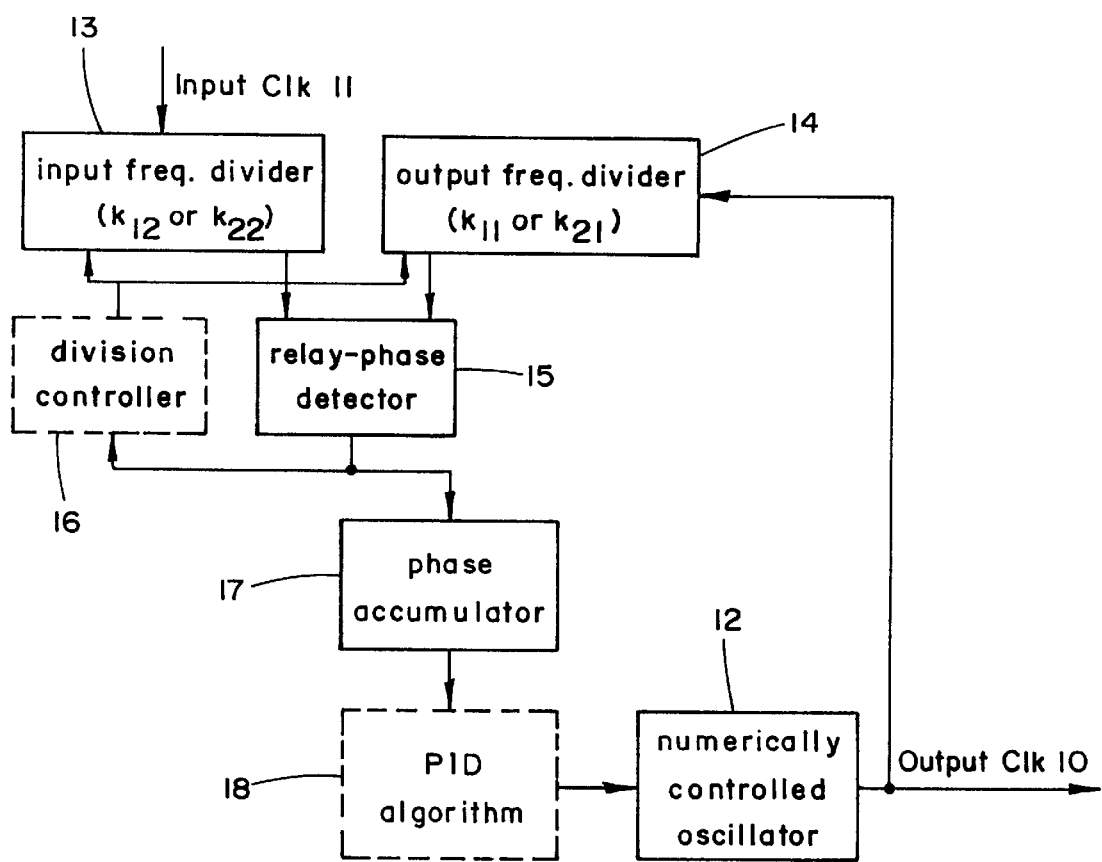
FIG. 1 is a block diagram of a circuit for implementing the frequency adjustment algorithm of the present invention for generating a local clock output signal whose frequency and phase are sychronized to the frequency and phase of an external input clock reference signal, wherein the clock output signal is a non-integer multiple of the input clock reference signal.

A primary challenge in the design of a System Timing Unit (STU) is the generation of a stable output clock which is a non-integer multiple of the intended reference clock signal. Zil'berg and Koltunov [A precision Digital Phase Discriminator for a Digital Network Synchronization System, originally published in Elektrosvyaz', No. 10, 1991, pp. 45–48.] have proposed an algorithm for making accurate phase difference measurements between a non-integer multiple of a reference clock and an output clock. Let $f_1$ and $T_1$ be the nominal frequency and period respectively of the output clock and let $f_2$ and $T_2$ be the nominal frequency and period respectively of the input clock. Zil'berg and Koltunov's algorithm uses two sets of divisors such that, if the ratio between the two clock frequencies remains nominal, the significant moments of the divided clocks will precess against each other with a fixed cyclical pattern. The algorithm naturally hinges upon the selection of these divisors $k_{11}$, $k_{12}$, $k_{21}$, and $k_{22}$, which are positive integers that satisfy $$k_{11}T_1 - k_{12}T_2 = k\Omega;$$

$$k_{21}T_1 - k_{22}T_2 = -Mk\Omega, \qquad 1$$

where M and k are given integers and $$\Omega = \frac{f}{f_1 f_2}, \qquad 2$$

where f is the greatest common divisor of $f_1$ and $f_2$. In a specific exemplary embodiment of FIG. 2, the input clock frequency $f_2$ is 1.544 MHz and the output clock frequency $f_1$ is 12.96 MHz. In this example, f is 8,000 and $\Omega$ is 40 nanoseconds.

The algorithm begins by dividing the output clock by $k_{11}$ and dividing the input clock by $k_{12}$. Equation 1 implies that the period of the divided input clock is $k\Omega$ seconds shorter than the divided output clock using this first set of divisors. In this case, the lag of the significant moment of the input clock behind the significant moment of the output clock decreases by $k\Omega$ for every cycle of the input clock. When the significant moment of the input clock crosses the significant moment of the output clock, the divisors are changed. At this point in time, the divisor of the output clock is changed to $k_{21}$ and the divisor of the input clock is changed to $k_{22}$, and equation 1 implies that the period of the divided output clock is $Mk\Omega$ shorter than the divided input clock. Thus, the lead of the significant moment of the input clock ahead of the significant moment of the output clock decreases by $Mk\Omega$ every cycle of the input clock. Thus, the significant moments of the input and output clocks will cross again and return to the original lag situation. As long as the nominal input and output frequencies are constant, the algorithm will observe M lags for every lead. This pattern of M lags per lead is called an M loop. The behavior of this algorithm will now be described mathematically. From equation 1, $$k_{11}T_1 - k_{12}T_2 = k\Omega;$$

$$k_{21}T_1 - k_{22}T_2 = -Mk\Omega.$$

Since $T_1 = 1/f_1$ and $T_2 = 1/f_2$ and using the definition of $\Omega$, $$\frac{k_{11}}{f_1} - \frac{k_{12}}{f_2} = k\frac{f}{f_1 f_2};$$

$$\frac{k_{21}}{f_1} - \frac{k_{22}}{f_2} = -Mk\frac{f}{f_1 f_2}.$$

Multiplying the equation system by $f_1 f_2$ on both sides, $$k_{11}f_2 - k_{12}f_1 = kf;$$

$$k_{21}f_2 - k_{22}f_1 = -Mkf. \qquad 3$$

Multiplying the first equation in system 3 by M and adding to the second equation, $$(MK_{11} + k_{21})f_2 - (Mk_{12} + k_{22})f_1 = 0, \qquad 4$$

$$(Mk_{11} + k_{21})f_2 = (Mk_{12} + k_{22})f_1,$$

$$\frac{f_2}{f_1} = \frac{(MK_{12} + k_{22})}{(Mk_{11} + k_{21})}.$$

Hence, the ratio $f_2/f_1$ can be specified by M and the divisors $k_{11}$, $k_{12}$, $k_{21}$, and $k_{22}$. Since the steps of this derivation are reversible, any pair of actual clocks having frequencies $f_{1a}$ and $f_{2a}$ that satisfy equation 4 will result in the nominal M loop behavior when fed into the algorithm.

Error Estimates

The constants $T_1$, $T_2$, $f_1$, and $f_2$ are nominal values used to derive the divisors $k_{11}$, $k_{12}$, $k_{21}$, and $k_{22}$. Let $T_{1a}$ and $T_{2a}$ be the periods of the actual output and input clocks respectively and let $f_{1a}$ and $f_{2a}$ be the corresponding frequencies. As demonstrated above, the nominal behavior of M lags per lead will be observed whenever $$\frac{f_{2a}}{f_{1a}} = \frac{f_2}{f_1} \qquad 4a$$

It is now shown how a measured lead/lag ratio can be used to estimate the error in the frequency ratio $f_{2a}/f_{1a}$. Define $$\varepsilon = \frac{T_{1a}}{T_{2a}} - \frac{T_1}{T_2}, \qquad 5$$

which implies that $$T_{1a} = \left(\frac{T_1}{T_2} + \varepsilon\right)T_{2a}.$$

Using equation 1 and manipulating, $$k_{11}T_{1a} - k_{12}T_{2a} = \left(\frac{k\Omega}{T_2} + k_{11}\varepsilon\right)T_{2a};$$

$$k_{21}T_{1a} - k_{22}T_{2a} = \left(\frac{-Mk\Omega}{T_2} + k_{21}\varepsilon\right)T_{2a}.$$
(6)

Multiplying the first equation in equation system 6 by M and adding it to the second equation, $$Mk_{11}T_{1a} - Mk_{12}T_{2a} + k_{21}T_{1a} - k_{22}T_{2a} = (Mk_{11} + k_{21})T_{2a}\varepsilon.$$
(7)

The right-hand side of equation 7 is the accumulated phase over an M loop. The right-hand side of the first equation of system 6 is the accumulated phase over a single set of clock edges with the first set of divisors. Thus, an M+n cycle will accumulate $$(Mk_{11} + k_{21})T_{2a}\varepsilon + n\left(\frac{k\Omega}{T_2} + k_{11}\varepsilon\right)T_{2a}$$

in phase. Thus, if a pattern of M+n loops is observed, the accumulated phase is zeroing out every cycle of this pattern, which implies that $$(Mk_{11} + k_{21})T_{2a}\varepsilon + n\left(\frac{k\Omega}{T_2} + k_{11}\varepsilon\right)T_{2a} = 0,$$
(8)

$$(Mk_{11} + k_{21})T_{2a}\varepsilon + nk_{11}\varepsilon T_{2a} = -\frac{nk\Omega}{T_2}T_{2a},$$

$$((Mk_{11} + k_{21}) + nk_{11})\varepsilon = -\frac{nk\Omega}{T_2},$$

$$\varepsilon = \frac{-nk\Omega}{T_2((Mk_{11} + k_{21}) + nk_{11})}$$

$$= \frac{-nkf}{f_1((Mk_{11} + k_{21}) + nk_{11})},$$

where the definition of $\Omega$ has been used. $\varepsilon$ can be used to calculate the difference between $f_{1a}$ and what it should be. In other words, since $f_{1a}$ should satisfy equation 4a, the discrepancy can be written as $$f_\Delta = f_{1a} - \frac{f_1}{f_2}f_{2a},$$

$$= f_{1a} - \frac{f_1}{f_2}\left(\frac{f_2}{f_1} + \varepsilon\right)f_{1a},$$

$$= f_{1a}\left(-\frac{f_1}{f_2}\varepsilon\right),$$

$$= \frac{f_{1a}f_1}{f_2 f_1}\left(\frac{nkf}{((Mk_{11} + k_{21}) + nk_{11})}\right),$$

$$= \frac{f_{1a}}{f_2}\left(\frac{nkf}{((Mk_{11} + k_{21}) + nk_{11})}\right),$$
(9)

where the definition of $\varepsilon$ (equation 5) has been used. Hence, in a tracking algorithm, the following frequency adjustment could be made to $f_{1a}$ approximate the desired frequency:

$$f_{1new} = f_{1old} - f_\Delta.$$

A similar estimate can be derived for $f_{2a}$:

$$f_\Delta = f_{2a} - \frac{f_2}{f_1}f_{1a},$$

$$= f_{2a} - \frac{f_2}{f_1}\left(\frac{1}{\varepsilon + f_2/f_1}\right)f_{2a},$$

$$= f_{2a}\left(1 - \frac{f_2}{f_1\varepsilon + f_2}\right).$$

In an algorithm, the following frequency adjustment could be made to $f_{2a}$ to approximate the desired frequency:

$$f_{2new} = f_{2old} - f_\Delta.$$

Resolution of Phase Discriminator

In practice, the time required to observe this frequency discrepancy ($f_\Delta$ in equation 9) is the time required for an M+n loop:

$$T_0 = (Mk_{11}T_{1a} + k_{21}T_{1a}) + nk_{11}T_{1a}.$$

If we multiply $f_\Delta$ by $T_0$, we obtain the observable phase discrepancy over an M+n loop:

$$f_\Delta T_o = \frac{T_{1a}f_{1a}nkf}{f_2}\left(\frac{(Mk_{11} + k_{21}) + nk_{11}}{((Mk_{11} + k_{21}) + nk_{11})}\right),$$

$$= \frac{nkf}{f_2},$$

$$= f_1 nk\Omega.$$

It is desirable in practice, for $f_\Delta T_0$ to be as small as possible because $f_\Delta T_0$ determines the resolution of the phase detection. Selecting $k_{11}$ and $k_{12}$ to minimize k in equation 1 maximizes the resolution of the algorithm.

Valid Operating Range of Algorithm

The valid operation of the algorithm depends upon the fact that the input and output clocks precess against each other which enables the counting of leads and lags. For clocks of period $T_{1a}$ and $T_{2a}$ to precess against each other, the algorithm requires (pursuant to equation) that $$k_{11}T_{1a} - k_{12}T_{2a} > 0;$$

$$k_{21}T_{1a} - k_{22}T_{2a} < 0,$$

which is equivalent to requiring that $$\frac{T_{1a}}{T_{2a}} > \frac{k_{12}}{k_{11}},$$

$$\frac{T_{1a}}{T_{2a}} < \frac{k_{22}}{k_{21}}.$$

The error tolerance allowed for the algorithm to function is now derived:

$$\frac{T_1(1 + \varepsilon_1)}{T_2(1 + \varepsilon_2)} = \frac{k_{12}}{k_{11}},$$

$$T_1(1 + \varepsilon_1) = \frac{k_{12}}{k_{11}}T_2(1 + \varepsilon_2),$$

$$T_1 - \frac{k_{12}}{k_{11}}T_2 = \frac{k_{12}}{k_{11}}T_2\varepsilon_2 - T_1\varepsilon_1,$$

$$\frac{k\Omega}{k_{11}} = \left(T_1 - \frac{k\Omega}{k_{11}}\right)\varepsilon_2 - T_1\varepsilon_1,$$

-continued $$\frac{k\Omega}{k_{11}}(1+\varepsilon_2) = T_1(\varepsilon_2 - \varepsilon_1).$$

Rearranging, $$\varepsilon_2 - \varepsilon_1 = \frac{k\Omega}{T_1 k_{11}}(1+\varepsilon_2),$$

$$\approx \frac{k\Omega}{T_1 k_{11}}.$$

Hence, a practical bound is determined for how much smaller the period of the output clock can be relative to the period of the input clock and for the algorithm still function correctly. Similarly, $$\varepsilon_1 - \varepsilon_2 = \frac{Mk\Omega}{T_1 k_{21}}(1+\varepsilon_2),$$

$$\approx \frac{Mk\Omega}{T_1 k_{21}},$$

which gives a practical bound for how much larger the period of the output clock can be relative to the period of the input clock and for the algorithm to still function correctly.

Implementation

The ratio of leads to lags measured in the phase discrimination algorithm is used as an input to the frequency adjustment algorithm. FIG. 1 is a block diagram of the entire frequency adjustment algorithm.

Based upon the Phase Discrimination Algorithm of the previous section, the phase accumulator maintains a count of lags per lead minus M. Hence, each M loop adds zero to the phase accumulator.

The output of the phase accumulator is used to control the oscillator producing the output clock signal 10, and can control it in many different types of servo controls, one of which can be a PID algorithm. The PID algorithm makes a frequency adjustment according to the following equation:

frequency adjustment=−S(C$_1$P+C$_2$I+C$_3$D), where S is a scaling function to limit the slew rate (overall gain) of the system, P is the current value of the phase accumulator, I is an average over a history of the phase accumulator, D is an approximation to the time derivative of the phase accumulator, and C$_1$, C$_2$, and C$_3$ are positive constants used to tune the responsiveness of the frequency tracking.

FIG. 1 is a block diagram of a circuit for implementing the frequency adjustment algorithm of the present invention for generating a local clock output signal 10 whose frequency and phase are synchronized to the frequency and phase of an external input clock reference signal 11. The circuit comprises a numerically controlled signal generator 12 for generating the clock output signal, whose frequency and phase are determined by a digital tuning word input to the numerically controlled signal generator.

The circuit also includes an input frequency divider 13 for dividing the input clock reference signal 11 by a first constant k$_{12}$ or a second constant k$_{22}$, and an output frequency divider 14 for dividing the output signal by a first constant k$_{11}$ or a second constant k$_2$. A relay-phase detector 15 receives output signals from the input frequency divider and the output frequency divider, and produces a binary (e.g. 0 or 1) output for each pair of corresponding edges of the two signals, depending upon the phase of which output signal (from 13 or 14) leads the phase of the other output signal. The pulsed output of the relay-phase detector 15 changes state only when the edge of one clock signal passes the edge of the other clock signal, and then changes state again when the edge of the other clock signal passes the edge of the one (first) clock signal. In a typical example, the phase detector 15 might produce n zeros (or ones—wherein n can be any number such as 35), followed by 1 one (or zero), followed by n zeros, 1 one, and etc.

Figure 2:
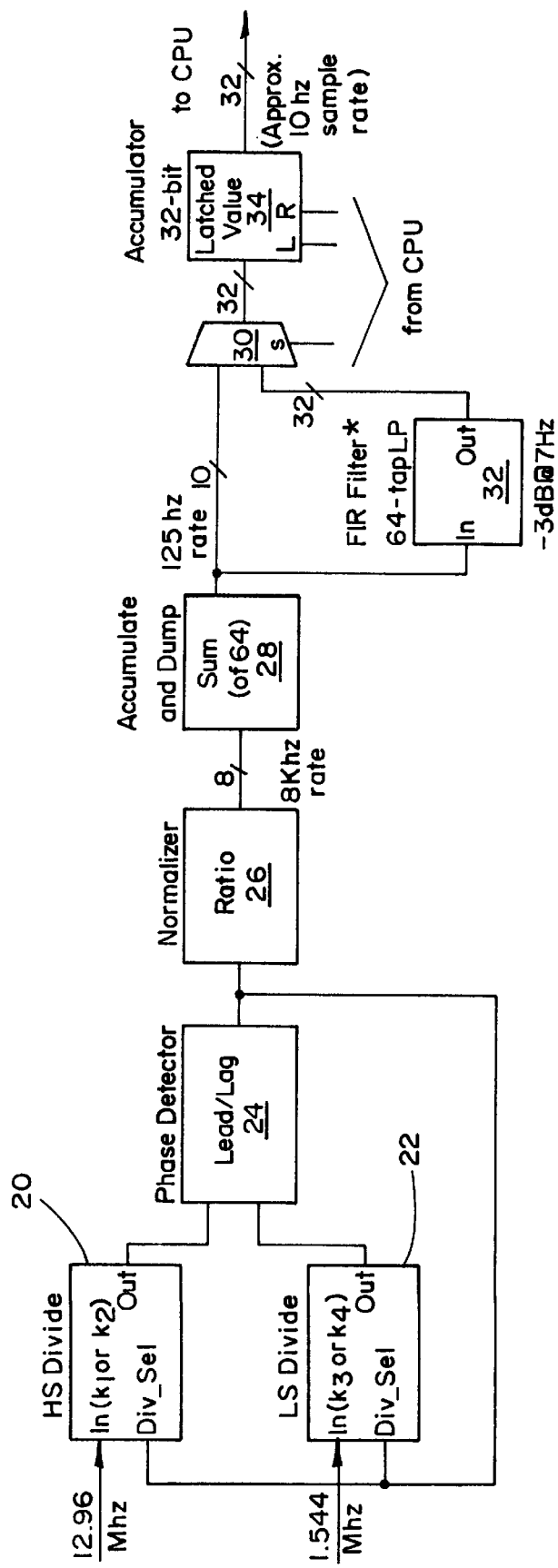
FIG. 2 is a block diagram of a digital phase discriminator circuit for a System Timing Unit Field Programmable Gate Array or Application Specific Integrated Circuit (ASIC).

The output of the relay-phase detector controls the input frequency divider 13 to divide by k$_{12}$ or k$_{22}$ and controls the output frequency divider 14 to divide by k$_{11}$ or k$_{21}$, depending upon the 0 or 1 output of the relay-phase detector, to cause the input frequency divider and the output frequency divider to shift from one set of constants k$_{12}$ and k$_{11}$ to the second set of constants k$_{22}$ and k$_{21}$ upon a change in the state (0 or 1) of the output signal of the relay-phase detector. FIG. 1 indicates a division controller 16 in phantom, as the division control can be accomplished internally within each frequency divider, as illustrated in the circuit of FIG. 2.

A phase accumulator 17 is coupled to the output of the relay-phase detector for detecting the accumulated phase output of the relay-phase detector, and the output of the phase accumulator 17 controls the numerically controlled signal generator 12. The ratio of measured leads to lags is used as an input frequency adjustment, and the phase accumulator maintains a count of lags per lead minus M.

The output clock signal is a non-integer multiple of the input clock reference signal. Pursuant to the algorithm, f$_1$ and T$_1$ are the nominal frequency and period respectively of the output clock signal, and f$_2$ and T$_2$ are the nominal frequency and period respectively of the input clock signal, and k$_{11}$, k$_{12}$, k$_{21}$ and k$_{22}$ are positive integers that satisfy $$k_{11}T_1 - k_{12}T_2 = k\Omega;$$

$$k_{21}T_1 - k_{22}T_2 = -Mk\Omega, \quad\quad 1$$

where M and k are given integers and $$\Omega = \frac{f}{f_1 f_2}, \quad\quad 2$$

where f is the greatest common divisor of f$_1$ and f$_2$.

In this embodiment, the output of the phase accumulator 17 is processed pursuant to a PID algorithm at 18, indicated in phantom, to control the oscillator 12, although other types of controls can be implemented in other embodiments. The frequency adjustment=−S(C$_1$P+C$_2$I+C$_3$D), where S is a scaling function to limit the slew rate of the system, P is the current value of the phase accumulator, I is an average over a history of the phase accumulator, D is an approximation of the time derivative of the phase accumulator, and C$_1$, C$_2$, and C$_3$ are positive constants for tuning the responsiveness of the frequency tracking.

FIG. 2 is a block diagram of a digital phase discriminator circuit for a System Timing Unit Field Programmable Gate Array (STU FPGA).

The circuit of FIG. 2 differs from the circuit of FIG. 1 by having two input clock signals at 12.96 MHZ and 1.544 MHZ, and either input clock signal (either 12.96 MHZ or 1.544 MHZ) can-be the input clock, and the other clock signal is then the output clock.

The two clock signals are input respectively to a high speed (HS) frequency divider 20 and a low speed (LS) frequency divider, similar to 13, 14, each of which divides its clock input by one of two constants (20−k$_1$ or k$_2$ and 22-$k_3$ or $k_4$), the outputs of which are directed to a relay-phase detector 24 similar to 15 which produces a 0 or a 1 output for each pair of corresponding edges of the two clock signals, depending upon the phase of which output signal (from 20 or 22) leads the phase of the other output signal. The output of the relay-phase detector 24 controls the frequency divider 20 to divide by $k_1$ or $k_2$ and controls the frequency divider 22 to divide by $k_3$ or $k_4$, depending upon the 0 or 1 output of the relay-phase detector, to cause the frequency divider 20 and the frequency divider 22 to shift from one set of constants $k_1$ and $k_3$ to the second set of constants $k_2$ and $k_4$ upon a change in the state (0 or 1) of the output signal of the relay-phase detector.

A normalizer 26 counts, at an 8 KHz frequency, the number of leads per lag, and then subtracts M, which normally produces a 0 count, but which can be positive or negative.

An accumulate and dump circuit 28 accumulates 64 of the outputs of circuit 26, and produces a signal at a 125 Hz rate (8 KHz/64).

A switch 30 controlled by a CPU directs either the direct output of circuit 28 or the output of circuit 28 directed through a Finite Impulse Filter 32, which is a digital low pass filter, to a 32 bit accumulator 34 which operates similar to phase accumulator 17. The output of accumulator 34 is then used in a feedback loop (not shown but similar to that shown in FIG. 1) to control the numerically controlled oscillator (not shown) which generates the output local clock signal (either 12.96 MHZ or 1.544 MHZ).

While several embodiments and variations of the present invention for a SONET local clock generator are described in detail herein, it should be apparent that the disclosure and teachings of the present invention will suggest many alternative designs to those skilled in the art.

What is claimed is:

1. A system for generating a clock output signal whose frequency and phase are synchronized to the frequency and phase of an external input clock reference signal, comprising:
   a. a numerically controlled signal generator for generating the clock output signal whose frequency and phase are determined by a control input signal;
   b. an input frequency divider for dividing the external input clock reference signal by a first constant $k_{12}$ or a second constant $k_{22}$;
   c. an output frequency divider for dividing the output signal by a first constant $k_{11}$ or a second constant $k_{21}$;
   d. a relay-phase detector, receiving output signals from the input frequency divider and the output frequency divider, for producing a 0 or a 1 output, which output controls the input frequency divider to divide by $k_{12}$ or $k_{22}$ and controls the output frequency divider to divide by $k_{11}$ or $k_{21}$, causing the input frequency divider and the output frequency divider to shift from one set of constants $k_{12}$ and $k_{11}$ to the second set of constants $k_{22}$ and $k_{21}$ upon a change in state of the output signal of the relay-phase detector; and
   f. a phase accumulator, coupled to the output of the relay-phase detector, for detecting an accumulated count of the phase outputs of the relay-phase detector, wherein the output of the phase accumulator controls the numerically controlled signal generator.

2. A system for generating a clock output signal as in claim 1, wherein the output clock signal is a non-integer multiple of the external input clock reference signal.

3. A system for generating a clock output signal as in claim 2, wherein $f_1$ and $T_1$ are the nominal frequency and period respectively of the output clock signal, and $f_2$ and $T_2$ are the nominal frequency and period respectively of the external input clock reference signal, and $k_{11}$, $k_{12}$, $k_{21}$ and $k_{22}$ are positive integers that satisfy $$k_{11}T_1 - k_{12}T_2 = k\Omega;$$

$$k_{21}T_1 - k_{22}T_2 = -Mk\Omega,$$

where M and k are given integers and $$\Omega = \frac{f}{f_1 f_2},$$

where f is the greatest common divisor of $f_1$ and $f_2$.

4. A system for generating a clock output signal as in claim 3, wherein the phase accumulator generates a ratio of measured leads to lags, and the phase accumulator maintains a count of lags per lead minus M.

5. A system for generating a clock output signal as in claim 1, wherein the output of the phase accumulator is processed pursuant to an algorithm to produce the control input signal for the numerically controlled signal generator which is controlled by the control input signal.

6. A system for generating a clock output signal as in claim 5 wherein the output of the phase accumulator is processed pursuant to an algorithm —$S(C_1P+C_2I+C_3D)$, where S is a scaling function to limit the slew rate of the system, P is a current output value of the phase accumulator, I is an average output value over a history of output values of the phase accumulator, D is an approximation of the time derivative of the phase accumulator, and $C_1$, $C_2$, and $C_s$ are positive constants.

* * * * *

UNITED STATES PATENT AND TRADEMARK OFFICE
CERTIFICATE OF CORRECTION

PATENT NO.   : 6,157,232
DATED        : December 5, 2000
INVENTOR(S)  : Brian F. Reilly et al.

Page 1 of 1

It is certified that error appears in the above-identified patent and that said Letters Patent is hereby corrected as shown below:

Title page,
Item [56], References Cited, OTHER PUBLICATIONS: delete the second instance of -- Hagiwara --

Column 2,
Line 23, "vista." should read -- vista --

Column 8,
Line 62, " can-be" should read -- can be --

Signed and Sealed this

Fifteenth Day of January, 2002

Attest:

JAMES E. ROGAN
*Director of the United States Patent and Trademark Office*

*Attesting Officer*

UNITED STATES PATENT AND TRADEMARK OFFICE
CERTIFICATE OF CORRECTION

PATENT NO. : 6,157,232
DATED : December 5, 2000
INVENTOR(S) : Brian F. Reilly et al.

It is certified that error appears in the above-identified patent and that said Letters Patent is hereby corrected as shown below:

<u>Title page,</u>
Item [73], Assignee, "NEC Corporation" should read -- NEC America, Inc. --

Signed and Sealed this

Twenty-third Day of April, 2002

Attest:

Attesting Officer

JAMES E. ROGAN
*Director of the United States Patent and Trademark Office*